(12) United States Patent
Yannou et al.

(10) Patent No.: US 8,541,865 B2
(45) Date of Patent: Sep. 24, 2013

(54) SEMICONDUCTOR DEVICE WITH IMPROVED ESD PROTECTION

(75) Inventors: Jean-Marc Yannou, Colomby sur Thaon (FR); Johannes Van Zwol, Beek-Ubbergen (NL); Emmanuel Savin, Soulangy (FR)

(73) Assignee: NXP B.V., Eindhoven (NL)

( * ) Notice: Subject to any disclaimer, the term of this patent is extended or adjusted under 35 U.S.C. 154(b) by 353 days.

(21) Appl. No.: 12/739,333

(22) PCT Filed: Oct. 22, 2008

(86) PCT No.: PCT/IB2008/054352
§ 371 (c)(1),
(2), (4) Date: Nov. 24, 2010

(87) PCT Pub. No.: WO2009/053912
PCT Pub. Date: Apr. 30, 2009

(65) Prior Publication Data
US 2011/0121425 A1    May 26, 2011

(30) Foreign Application Priority Data
Oct. 25, 2007  (EP) .................................. 07291293

(51) Int. Cl.
*H01L 29/866*   (2006.01)
*H01L 21/762*   (2006.01)

(52) U.S. Cl.
USPC .... 257/514; 257/501; 257/506; 257/E29.335; 257/E21.546; 438/424; 438/459

(58) Field of Classification Search
USPC ......................................................... 257/514
See application file for complete search history.

(56) References Cited

U.S. PATENT DOCUMENTS

| | | | |
|---|---|---|---|
| 5,627,399 A * | 5/1997 | Fujii | 257/501 |
| 6,385,028 B1 | 5/2002 | Kouno | |
| 6,642,550 B1 | 11/2003 | Whitworth et al. | |
| 2004/0135141 A1 | 7/2004 | Pequignot et al. | |
| 2006/0131654 A1 | 6/2006 | Poulton | |

FOREIGN PATENT DOCUMENTS

| | | |
|---|---|---|
| DE | 19927727 A1 | 12/1999 |
| EP | 1605508 A2 | 12/2005 |
| EP | 1703561 A2 | 9/2006 |

\* cited by examiner

*Primary Examiner* — Jerome Jackson, Jr.

(57) ABSTRACT

The present invention relates to a semiconductor device, comprising a semiconductor substrate (102) with a thickness of less than 100 micrometer and with a first substrate side and an opposite second substrate side. A plurality of at least four monolithically integrated Zener or avalanche diodes (164, 166, 168, 170) with a reverse breakdown voltage of less than 20 V are defined in the semiconductor substrate and connected with each other in a series connection. The diodes defined in a plurality of mutually isolated substrate islands (120,122,124,126) in the semiconductor substrate, at least one diode per substrate island. The substrate islands are laterally surrounded by through-substrate isolations extending from the first to the second substrate side and comprising a filling (128) that electrically isolates a respective substrate island from a respective laterally surrounding area of the semiconductor substrate.

13 Claims, 7 Drawing Sheets

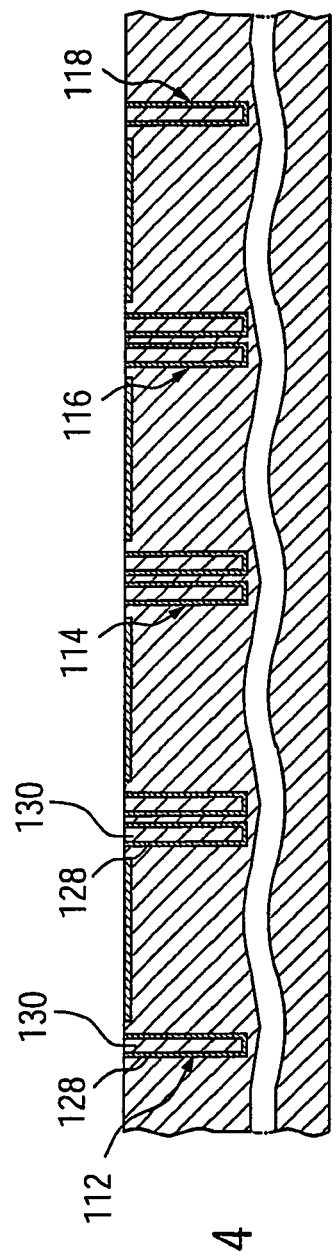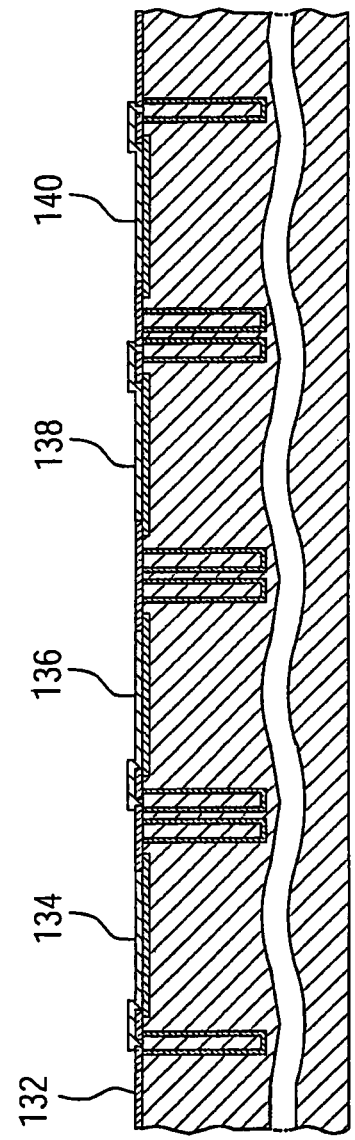

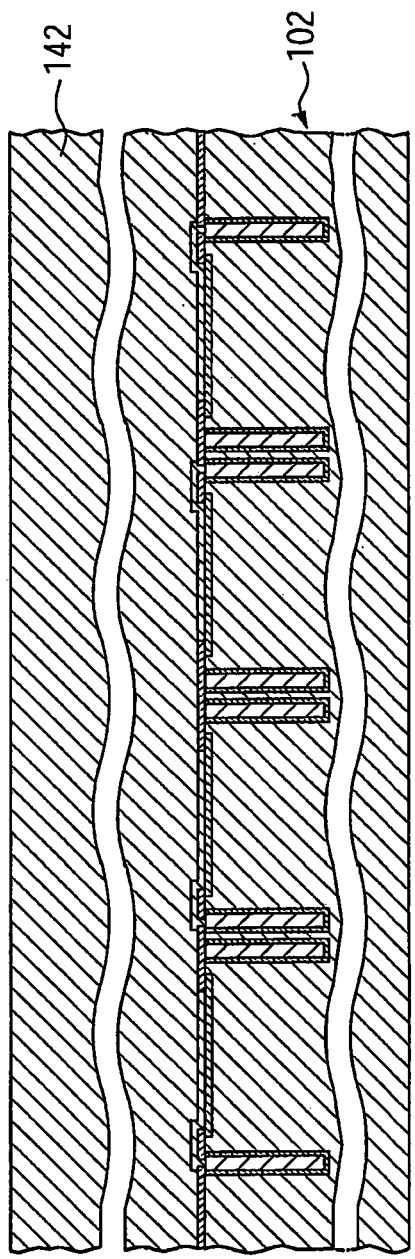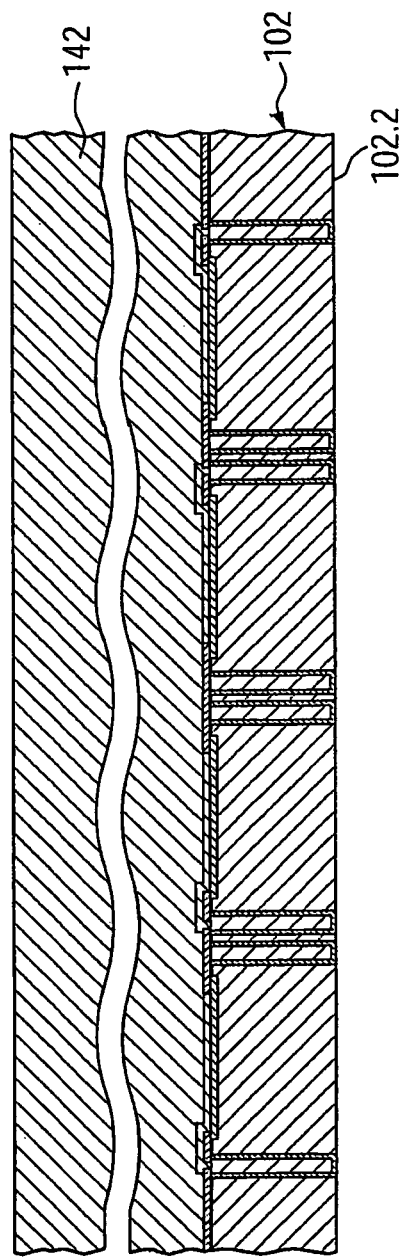

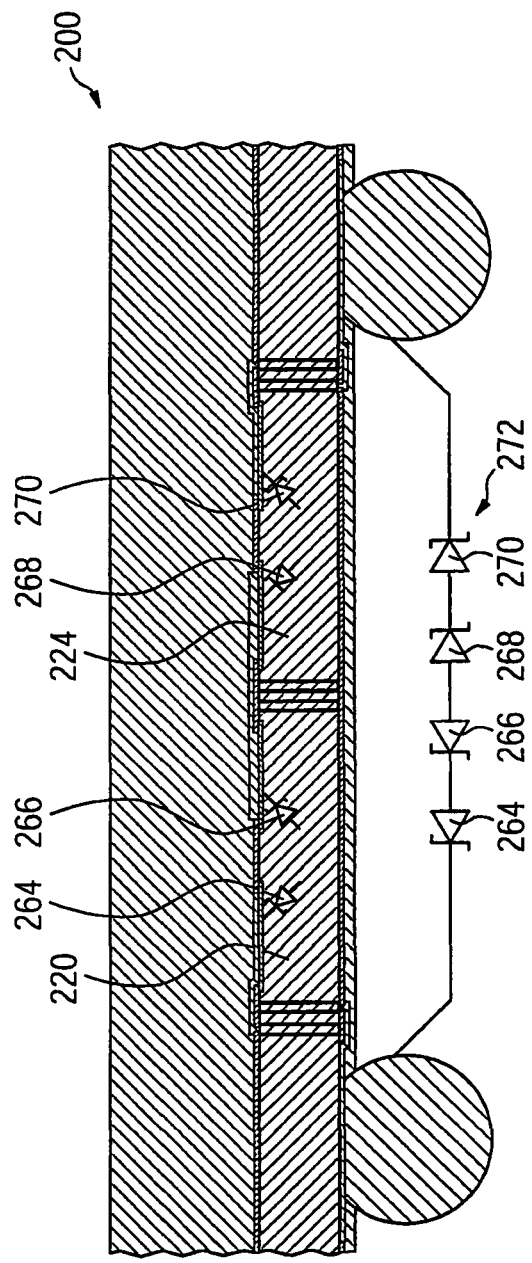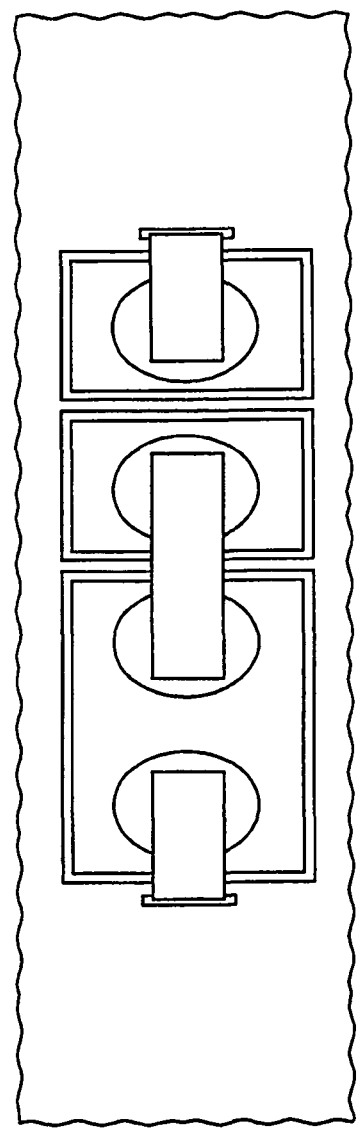

SEMICONDUCTOR DEVICE WITH IMPROVED ESD PROTECTION

FIELD OF THE INVENTION

The present invention relates to a semiconductor device, a semiconductor assembly comprising a first and a second semiconductor device, and to a method for fabricating a semiconductor device. The invention relates to the field of protection of a semiconductor device against electrostatic discharge (ESD). Without restricting the applicability of the invention, an example of an application field of the invention is a semiconductor device for automotive applications.

BACKGROUND OF THE INVENTION

Many semiconductor devices comprising integrated circuits have an ESD protection structure monolithically integrated within the semiconductor substrate. For instance, in the field of automotive applications, transceiver ICs for Control Area Network (CAN) communication may comprise monolithically integrated ESD protection structures.

Known ESD protection structures comprise monolithically integrated back-to-back Zener or avalanche diodes. For instance, U.S. Pat. No. 6,642,550 B1 describes a sub-mount for use in a light emitting diode (LED). The sub-mount comprises an ESD protection structure in the form of two back-to-back Zener diodes, which are monolithically integrated into the semiconductor substrate of the sub-mount. A first Zener diode is formed by a pn-junction between a n+-type sinker and a p-type substrate region. A second Zener diode is formed by the junction between the p-type substrate region and an underlying n+-type substrate region extending to a bottom substrate-side of the semiconductor substrate.

A disadvantage of this structure is that it does not withstand high-voltage ESD pulses that are for instance to be used in ESD stress tests ("gun tests") of semiconductor devices connected to voltage sources of more than 40 Volt. An ESD stress test according to the standard IEC61004-2 uses a short initial high-current pulse with a rise time (10 to 90% of peak amplitude) of between 0.7 and 1 Nanosecond.

It would be desirable to improve a semiconductor device to allow providing an ESD protection with both, a high reverse trigger voltage and fast switching characteristics to reduce the occurrence of device failure do to electrostatic discharge.

SUMMARY OF THE INVENTION

According to a first aspect of the invention, a semiconductor device is provided that comprises a semiconductor substrate with a thickness of less than 100 micrometer and with a first substrate side and an opposite second substrate side, and a plurality of monolithically integrated Zener or avalanche diodes with a reverse breakdown voltage of less than 20 V, which are defined in the semiconductor substrate and which are connected with each other in a series connection.

In the semiconductor device of the invention, the diodes are defined monolithically in a plurality of mutually isolated substrate islands in the semiconductor substrate, at least one diode per substrate island. Furthermore, the substrate islands are laterally surrounded by through-substrate isolations extending from the first to the second substrate side and comprising a filling that electrically isolates a respective substrate island from a respective laterally surrounding area of the semiconductor substrate.

The semiconductor device of the first aspect of the present invention provides a protection against ESD-related damage with a structure that allows obtaining fast switching characteristics in a combination with a high reverse breakdown voltage.

While a high reverse trigger voltage alone, such as for instance 60 Volt, can be reached in prior-art semiconductor devices with single Zener or avalanche diodes, such diodes are not suitable for achieving fast switching characteristics. For a stand-alone diode can be modelled as an ideal junction diode in series with a parasitic resistance. For high trigger voltages, this parasitic resistance is considerably higher than for diodes with a reverse trigger voltage below 20 Volt, typically in the range of 5 Volt to 15 Volt. As a consequence, during an initial short high-current peak of an ESD event, high voltage overshoots would be observed between the electrodes of this parasitic resistance, when using such a high-voltage Zener or avalanche diode.

In contrast, the semiconductor device of the first aspect of the invention provides a plurality of Zener or avalanche diodes with a reverse breakdown voltage of less than 20 V on mutually isolated substrate islands in the semiconductor substrate. This way, the short switching characteristics of Zener or avalanche diodes with a smaller reverse breakdown voltage can be exploited while allowing to meet requirements on a high reverse breakdown voltage of the ESD protection structure in the semiconductor device.

In the following, embodiments of the semiconductor device of the invention will be described. The embodiments can be combined with each other, unless they clearly form alternatives to each other.

The number of diodes can be chosen according to the requirements of a particular application case. For providing a structure with a high reverse breakdown voltage, e.g., in the range of higher than 40 V, at least four monolithically integrated Zener or avalanche diodes, suitably with a reverse breakdown voltage of between 5 and 15 V each, can be used to advantage. For instance, 4 or 5 diodes with a reverse breakdown voltage of 14 to 15 V or, alternatively, 8 diodes with a breakdown voltage of 8 V can be used to provide a total reverse breakdown voltage in the range of 60 V. In comparison with prior-art semiconductor devices such as those known from U.S. Pat. No. 6,642,550 B1, these embodiments not only provide a high breakdown voltage, but also achieve particularly low parasitic resistive and inductive effects in combination with fast switching characteristics.

In one embodiment of the semiconductor device, a first metallization is provided on the first substrate side, and a second metallization is provided on the second substrate side. The through-substrate isolations comprise an electrically conductive via, which is electrically isolated from the semiconductor substrate by an insulation layer and which provides an electrical pathway between the first and second substrate sides. This embodiment forms a platform to build many different configurations of a series connection of diodes. All configurations are based on identical diode structures on all substrate islands. The type of electrical connection between the diodes, be it a back-to-back connection, or a back-to-front connection, or a front-to-front connection can be defined by a proper layout of the metallization in the back-end processing without any modification being required in the front-end processing.

The electrically conductive via can for instance be formed by a tungsten filling inside a trench structure forming the through-substrate isolations. The through-substrate isolations may for instance surround a respective substrate island in a ring shape. Other suitable shapes of the lateral isolations of the substrate islands are rectangular, elliptic, oval or quadratic shapes.

Suitably, the substrate is made of silicon. However, other substrate materials, such as III-V semiconductors can be used as well.

In a further preferred embodiment, the series connection of Zener or avalanche diodes comprises at least two such diodes connected with each other in a back-to-back configuration. This way, ESD protection is provided for different polarities of ESD pulses and can thus handle current pulses in opposite directions.

A particularly suitable diode structure for fabrication in the frontend processing has substrate islands with a first conductivity type and diodes, which, to form their respective pn-junction, comprise a substrate region of an opposite second conductivity type in the respective substrate island. The substrate region is laterally embedded in the substrate island on one substrate side. Diodes in different substrate islands can be connected through the first or second metallization and the via according to a desired serial configuration.

In order to achieve particularly high switching speeds, the series connection of diodes preferably comprises at least two pairs of serially connected diodes. The diodes of each pair are connected back-to-front with each other, and the two pairs are connected back-to-back or front-to-front.

In one embodiment, at most two diodes are arranged in a respective substrate island. In any case, where two diodes are arranged in one substrate island, they are preferably provided in a back-to-back configuration of the series connection of diodes. This configuration can be achieved by laterally arranging substrate regions of the second conductivity type in a respective substrate island of the first conductivity type, with a lateral distance from each other. As an example, where the side length of a diode is 200 Micrometer, a suitable distance between two neighboring diodes is approximately 100 Micrometer. This arrangement of two back-to-back diodes in one substrate island helps reducing the resistance between them.

A further reduction of the electrical resistance of the series connection of diodes is achieved in an embodiment, in which the substrate has a thickness of less than less than 50 Micrometer. In one example with a particularly low resistance of the series connection of diodes, the thickness of the semiconductor substrate is even only 20 Micrometer. As explained before, reducing the electrical resistance between the individual diodes further enhances the switching speed. The rise time of less than 1 Nanosecond can be achieved during the initial high-current peak in test configurations such as the "gun test model" of the norm IEC 6100-4-2. However, special attention is required for processing such semiconductor devices with thin semiconductor substrates.

The number of diodes of the series connection in the semiconductor device is at least four. The number of diodes should be chosen such that a sum of their reverse breakdown voltages exceeds an application-specific requirement of the reverse trigger voltage. As an example, an application-specific reverse trigger voltage of 60 Volt is suitable for use in a 42 Volt-battery system of car batteries. A particularly fast switching with a trigger threshold voltage of 60 Volt is achieved in a configuration with 8 avalanche diodes that have a reverse breakdown voltage of 8 Volt. As an alternative, 4 avalanche diodes with a breakdown voltage of 14 Volt can be used. An optimal number of diodes in combination with a optimum breakdown voltage can be found in a respective application case by taking into consideration that Zener or avalanche diodes with higher breakdown voltages imply higher parasitic resistances, while a larger number of Zener or avalanche diodes with a lower breakdown voltage may on the other hand also have an increased resistance due to a longer current path along the semiconductor substrate and the metallizations. To reduce this current path, besides by providing a small thickness of the semiconductor substrate, neighboring diodes of the series connections preferably have a lateral distance of between 50 and 150 Micrometer only.

The semiconductor device is suitably provided with other circuit elements such as capacitors or inductors. Capacitors can be used for decoupling an integrated circuit connected with the semiconductor device either on the same semiconductor substrate or on a different semiconductor substrate. Inductors can be used to force an ESD current through the series connection of diodes and avoid a current flow through a connected integrated circuit.

In one preferable configuration, the semiconductor device of the first aspect of the invention forms a part of a semiconductor assembly that further comprises a second device. The second semiconductor device may also be a printed circuit board, but an in another embodiment be a semiconductor device as well. The semiconductor devices are typically provided in the form of a chip assembly.

In an assembly, such as a system-in-package (SiP), the semiconductor device according to the first aspect of the invention suitably has electrical connectors for contacting and/or mounting it to the second device. Suitably, conductive bumps are provided on one substrate side, typically away from the substrate side that has the diodes.

The second semiconductor device comprises in one embodiment an integrated circuit. The series connection of diodes is then for instance connected between a signal input of the integrated circuit and a ground connection of the integrated circuit. Inductors may suitably be arranged between the series connection of diodes and the respective connection of the signal and ground lines to the integrated circuit.

In one embodiment that is particularly advantageous in automotive and industrial applications, the integrated circuit of the second device may by a transceiver circuit according to the control access network (CAN) standard. However, a CAN transceiver can in an alternative embodiment be provided on the first semiconductor device.

According to a second aspect of the invention, a method for fabricating a semiconductor device is provided. The method comprises:

providing a semiconductor substrate with a first and an opposite second substrate side;

defining a plurality of at least four monolithically integrated Zener or avalanche diodes in the semiconductor substrate on the first substrate side;

defining a plurality of substrate islands in the semiconductor substrate laterally surrounded by the trenches, with at least one diode per substrate island;

fabricating a filling in the trenches that electrically isolates a respective substrate island from a respective laterally surrounding area of the semiconductor substrate;

thinning the substrate from the second substrate side to a thickness of less than 100 micrometer, such that the fillings form through-substrate isolations extending from the first to the second substrate side.

The method of the second aspect of the invention shares the advantages of the semiconductor device of the first aspect of the invention.

In the following, embodiments of the method will be described.

A solution for achieving substrate thicknesses of down to 20 micrometer or even less, is provided in embodiments, in which the step of thinning the substrate comprises mounting a semiconductor wafer comprising the semiconductor substrate as an integral part on a carrier substrate, the first substrate side facing the carrier substrate; grinding the semiconductor wafer from the second substrate side.

This processing keeps the semiconductor stable during and after the thinning step.

In another embodiment, fabricating a filling in the trenches comprises depositing an insulation layer in the trenches, followed by fabricating an electrically conductive via in the trenches, which via provides an electrical pathway between the first and second substrate sides.

In a further embodiment, a metallization is fabricated on the first substrate side before the thinning.

Preferred embodiments of the invention are also in the dependent claims.

BRIEF DESCRIPTION OF THE DRAWINGS

In the following drawings

FIGS. 1 to 10 show schematic cross sectional views of a semiconductor device according to a first embodiment during different stages of its fabrication.

FIG. 12 shows a schematic cross sectional view of a semiconductor device, according to a second embodiment.

FIG. 13 shows a schematic top view of the semiconductor device of FIG. 12

DETAILED DESCRIPTION OF EMBODIMENTS

FIGS. 1 to 10 show schematic cross sectional views of a semiconductor device according to a first embodiment during different stages of its fabrication.

Figure 1:
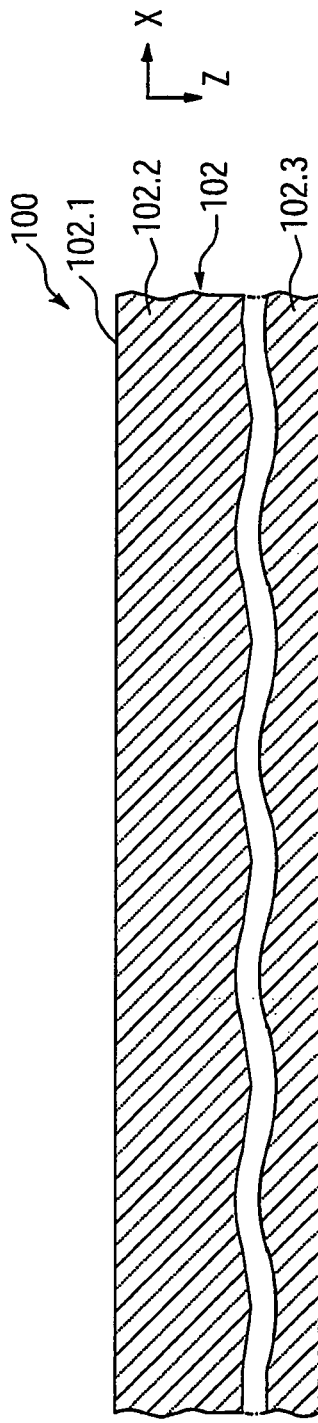

FIG. 1 shows a semiconductor device 100 at an initial stage of its fabrication. At this point, a semiconductor substrate 102 is provided. The semiconductor substrate 102 is only shown in a lateral section relevant for describing the ESD protection structure. Also, to make features fabricated during subsequent processing steps on a first substrate side 102.1 better visible, only a top substrate region 102.2 extending near the first substrate side 102.2 and a bottom substrate region 102.3 extending near a second substrate side 102.4 are shown in FIG. 1 and the following Figures. In the following description, use of the word "top" and "bottom" is made only with respect to a representation of the semiconductor device 100 in the enclosed drawings on paper or on a screen, and does not imply any restriction on the usage or arrangement a respective structural element of the semiconductor device.

For the purpose of the present example, without restriction, the semiconductor substrate 102 of the present embodiment is a p-conductive silicon wafer with a thickness of 675 micrometer. Other substrate materials and other thicknesses can be used, depending on the boundary conditions of the respective device application and an applied processing technology during fabrication.

Figure 2:
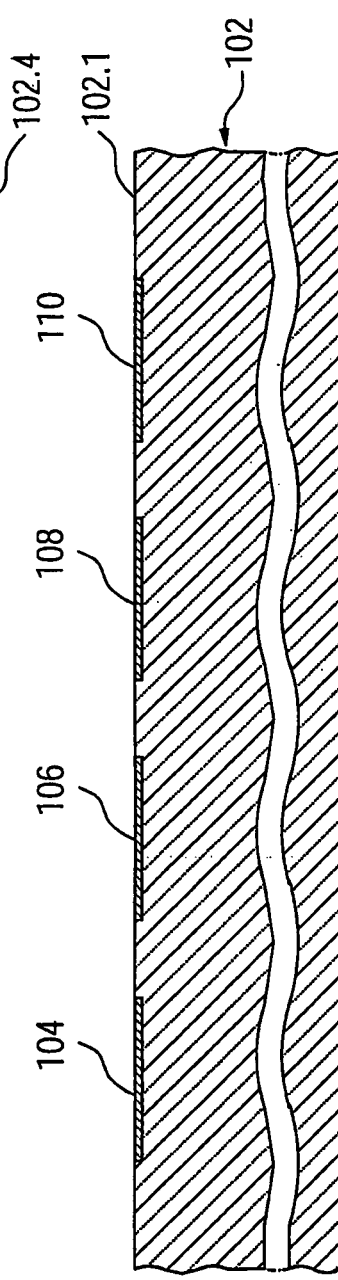

In a subsequent processing step, the result of which is shown in FIG. 2, a four Zener or avalanche diodes with a reverse breakdown voltage of less than 20 V, typically 5 to 15 V, are defined in the semiconductor substrate 102 by a corresponding masked implantation of an n-type dopant into substrate regions 104 to 110. Phosphorous P is an example of suitable dopant. As is known in the art, a Zener or avalanche diode contains a heavily doped p-n junction allowing electrons to tunnel from a valence band of the p-type material to the conduction band of the n-type material. The dopant concentration is used to define the reverse breakdown voltage. Zener diodes and avalanche diodes are difficult to distinguish because both, the Zener and the avalanche effect are often present in such diodes in parallel. However, as is understood in the art, the Zener effect is predominant in silicon diodes for reverse voltages of less than 6 V, while for higher reverse voltages, the avalanche effect becomes the predominant mechanism that generates a current flow under application of a reverse voltage to the diode, which voltage has an amount higher than the threshold or trigger voltage, which is also called the reverse breakdown voltage.

While in the present embodiment four different n-type substrate regions 104, 106, 108 and 110 are fabricated, this is not to be understood as a restriction. The number of diodes is selected according to the requirements of a particular application. For purposes of graphical simplicity, the same reference numerals as for the n-type substrate regions 104 through 110 will also be used for the corresponding diodes.

Figure 3:
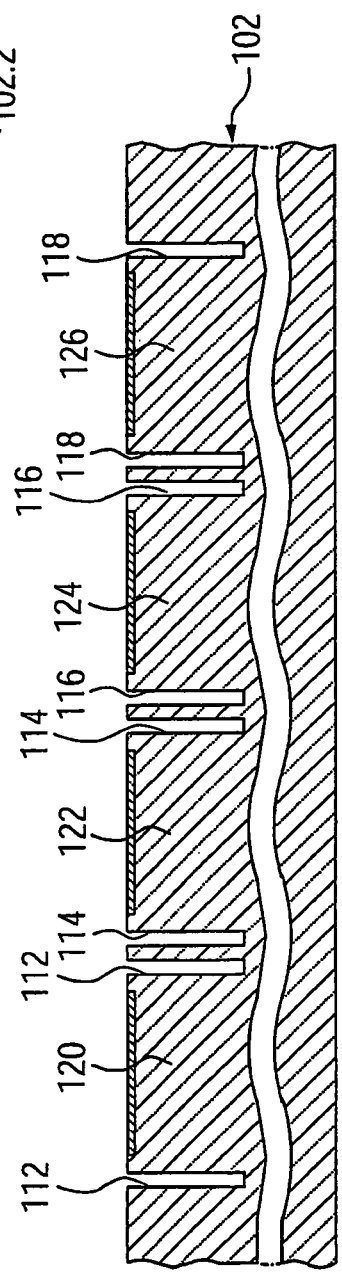

In a following processing step, the result of which is shown in FIG. 3, deep trenches are fabricated in the silicon substrate 102, shown by reference labels 112 through 118. Deep reactive ion etching can be for instance used at this point. The respective trenches have a shape of a rectangular ring in the present embodiment, thus defining respective substrate islands 120 through 126 in the semiconductor substrate 102. Each substrate island contains one p-n junction in the present embodiment.

The trenches have a depth that serves to define the thickness of the substrate after a grinding step during later processing. In the present example, the trenches have a depth of 20 micrometer. The width of the trenches is chosen so as to allow the formation of an insulating layer on the sidewalls of the trench, and of an electrically conductive viewer, which fills the trench between opposite faces of the insulating layer. In the present example, a width of approximately 4 micrometer is suitable. However, the width can be larger or smaller, depending on the available processing technology and the desired resistance parameters of the electrically conductive viewer formed in the trench.

For many applications, a particularly low resistance is favorable to enhance the switching speed of a series connection of diodes. In a subsequent processing step, the result of which is shown in FIG. 4, the trenches 112 to 118 are filled with an insulating layer 128, followed by a deposition of a metallic filling 130. The insulating layer 128 is to form a through-substrate isolation extending from the first substrate side to the second substrate after later processing steps, see FIG. 7 and the related description. A suitable insulating material is silicon dioxide. As an alternative, silicon nitride can be used. A suitable material for the metallic filling is tungsten W. However, other electrically conductive materials such as Al, Al(Cu), or Al(Si) can be used as well.

The deposition of the layers can be performed using the same mask (not shown) as that used for the fabrication of the trenches 112 to 118. That means that this mask does not have to be removed during the different process steps leading to the intermediate states of FIGS. 3 and 4. Note that the thickness of the insulation layer 128 in the present example is typically 500 Nanometer.

Following processing steps, the result of which is shown in FIG. 5, comprise a deposition of an insulating top layer 132 on the first substrate side followed by patterning of this layer and a deposition of a top metallization to form interconnects 134 to 140. The top metallization forms the first metallization in the language of the claims. A suitable material for the interconnects is aluminum. The interconnect pattern will be explained further below with reference to FIG. 10.

In a subsequent processing step, the result of which is shown in FIG. 6, the semiconductor substrate 102 is mounted onto a carrier substrate 142, the first substrate side 102.1 facing the carrier substrate 142. The carrier substrate 142 may be made of glass or another suitable insulating material. It serves as a mechanical support during subsequent grinding and during the following processing, so as to avoid breakage of the semiconductor substrate 102.

The semiconductor substrate 102 is then thinned down to a thickness of approximately 20 micrometer by grinding, cf. FIG. 7. The grinding process is continued until the tungsten fillings 130 of the trenches 112 to 118 are exposed on the second substrate side 102.2. At this point, thus, mutually isolated substrate islands 120 to 126 are defined by the filled trenches 112 to 118. The filled trenches 112 to 118 laterally surround the respective substrate islands (cf. FIGS. 11, 13, and 15) and form through-substrate isolations that electrically isolate a respective substrate island from a respective laterally surrounding area of the semiconductor substrate 102. The insulating layer 128 forms an isolating filling of the through-substrate isolations and extends from the first to the second substrate side as well.

Figure 8:
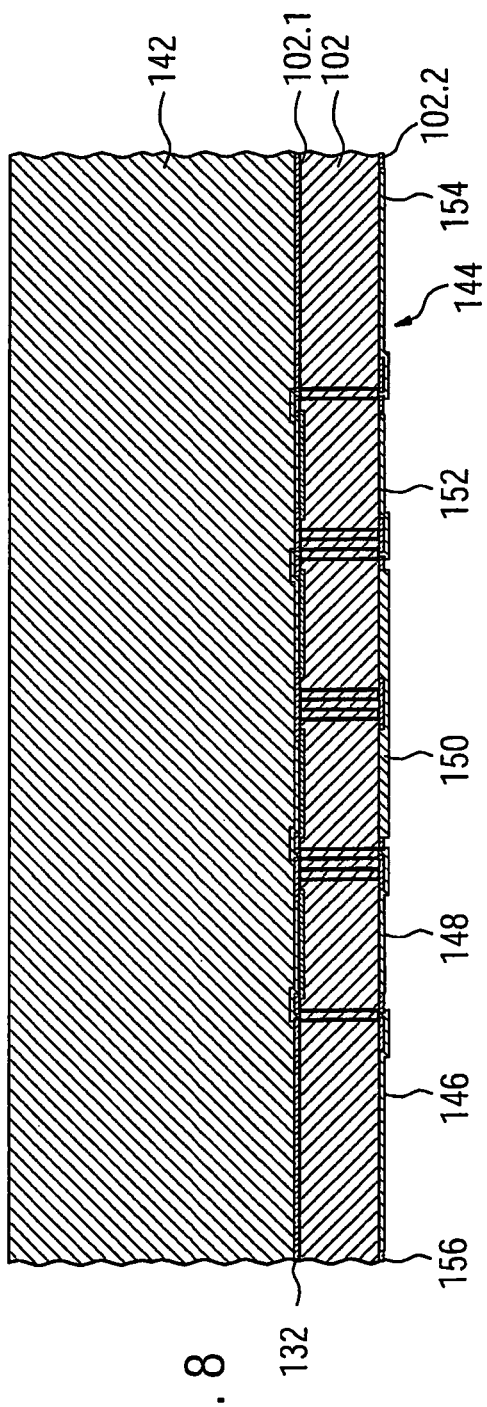

In a following processing step, the result of which is shown in FIG. 8, a second metallization 144 (bottom metallization) is fabricated on the second substrate side 102.4. The second metallization is patterned to form aluminum interconnects 146 to 154. Note that the second metallization is formed on a bottom isolation layer 156 corresponding to the isolation layer 132 on the first substrate side 102.1. The bottom isolation layer 156 is opened at selected positions to provide an electrical pathway from a respective metal via 130 to a respective interconnect of the bottom metallization 144.

Figure 9:
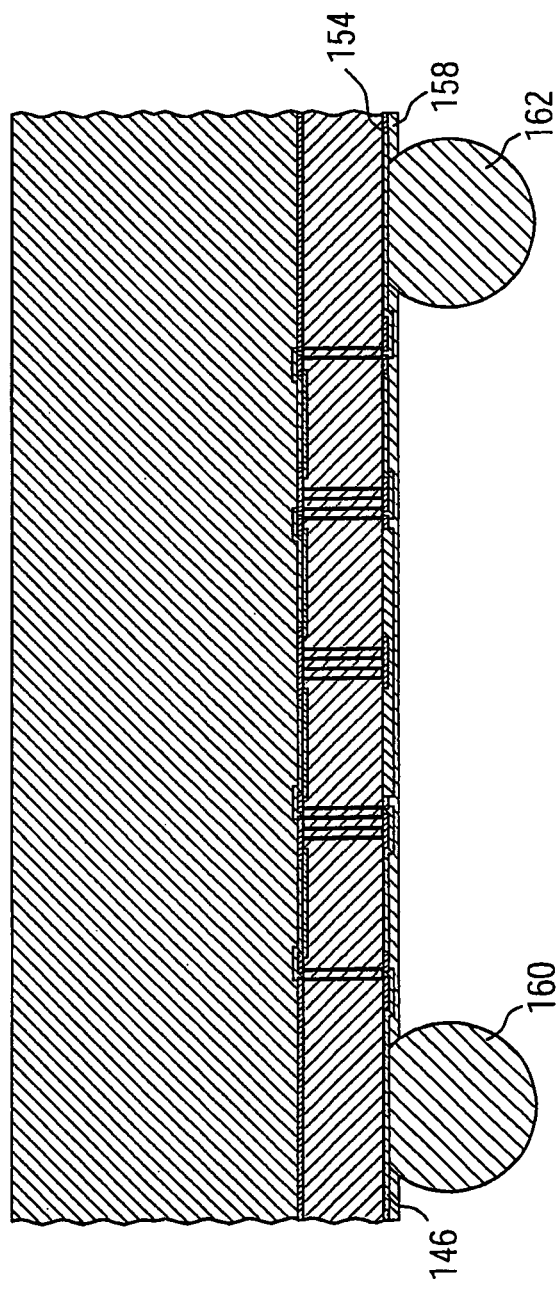

In a subsequent processing step, the result of which is shown in FIG. 9, the second substrate side 102.2 is covered by a bottom passivation layer 158, followed by the fabrication of electrically conductive bumps 160 and 162, which are connected to the interconnects 146 and 154, respectively. The structure resulting from this processing is in the following described with reference to FIGS. 10 and 11.

Figure 10:
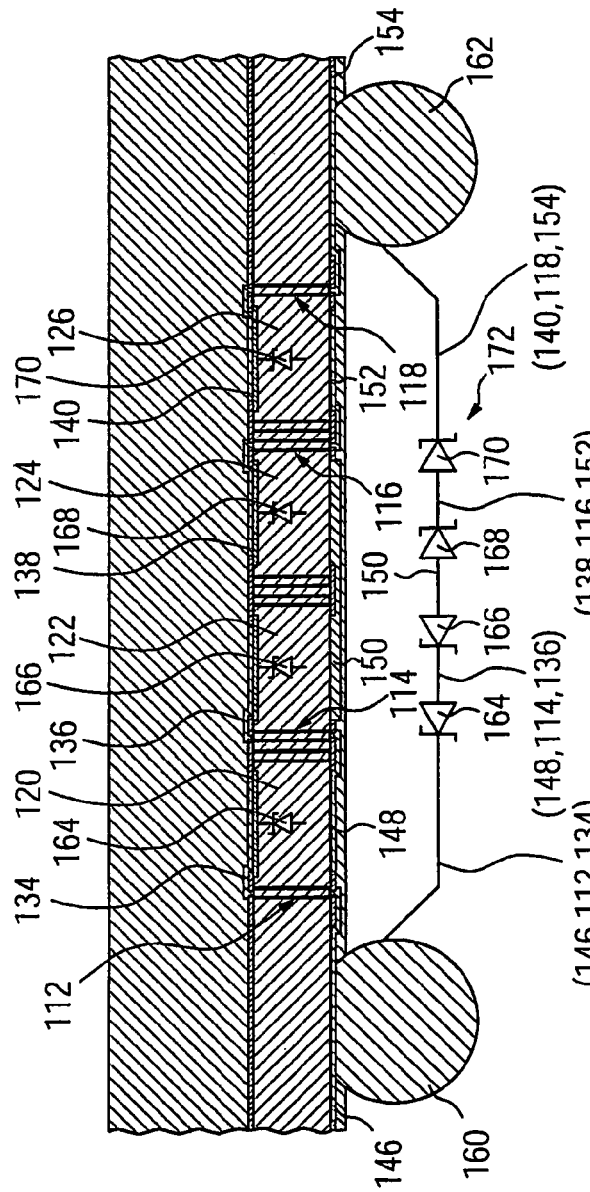
Figure 11:
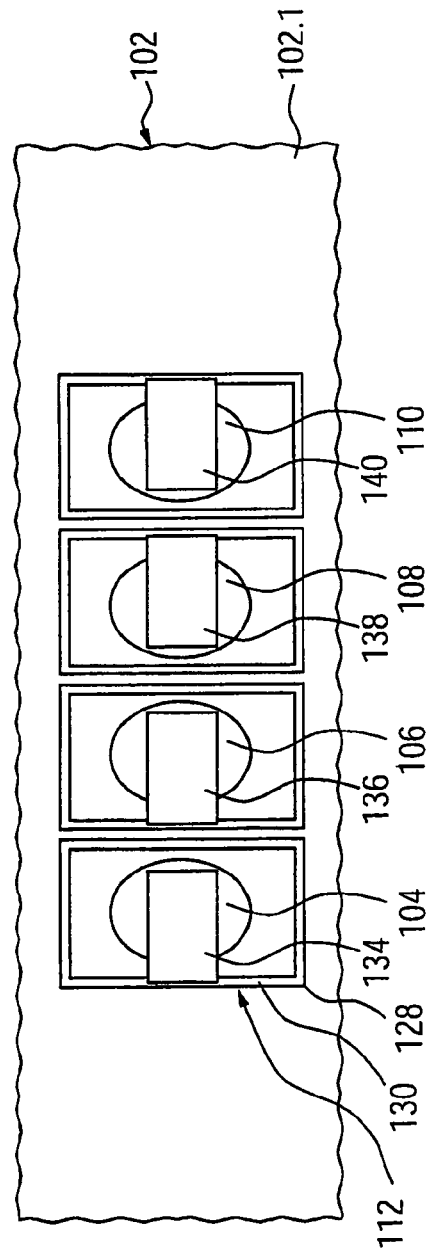
FIG. 11 shows a top view of the semiconductor device of FIG. 10.

FIG. 10 is a schematic cross sectional view corresponding to that of FIG. 9, with the only exception that the resulting electrical circuit diagram is also shown schematically. FIG. 11 shows a top view of the semiconductor substrate 102 to clarify the interconnect structure used to obtain the series connection indicated in FIG. 10. As can be seen, the provision of the four n-type regions 104 to 110 defines avalanche diodes, which are represented schematically, without restriction, as first to fourth Zener-diodes 164 to 170 connected to form a series connection 172 between the metal bumps 160 and 162.

The first diode 164 is connected to the metal bump 160 through the bottom metallization 146, the tungsten via of trench 112 and the top metallization 134. The backside of the first diode 164 is connected to front side of the diode 166 by the bottom metallization 148, the via of trench 114, and a top metallization 136. The backside of the second diode 166 is connected to the backside of the diode third 168 through the metallization 150. The front side of the diode third 168 is connected to the backside of the fourth diode 170 through the top metallization 138, the tungsten via of trench 116, and the bottom metallization 152. Finally, the front side of the fourth diode 170 is connected to the second metal bump 162 through the top metallization 140, the tungsten via of the trench 118 and the bottom metallization 154.

In the circuit architecture of the embodiment of FIGS. 1 through 11, therefore, two pairs of diodes 164, 166 and 168, 170 provide an ESD protection for ESD-events with any polarity. The use of four diodes, which are arranged on mutually isolated substrate islands 120 to 126 allows to define the connection pattern of the interconnects on the basis of an identical device platform structure by suitably varying the processing steps following that shown in FIG. 4.

The structure of FIGS. 10 and 11 is particularly suitable for applications requiring protections under high voltages and a fast switching in the event of an ESD. Such requirements are specifically stringent in automotive applications, such as in a transceiver used for a CAN System.

An alternative, but equivalent architecture is shown in FIGS. 12 and 13. The semiconductor device 200 of FIGS. 12 and 13 also has four Zener or avalanche diodes 264 to 270. However, in contrast to the examples of FIGS. 1 through 11, the substrate islands 220 and 224 each contain two Zener diodes 264, 266 and 268, 270 respectively. Using a suitable patterning of the top metallization, a series connection 272 is obtained, which connects the diodes 266 and 268 front-to-front, while the connection of each diode pair in respective substrate islands is back-to-back. The functionality of this embodiment corresponds to that of the embodiment of FIGS. 1 through 11. However, the electrical resistance between the diodes of a respective diode pair in a single substrate island is even smaller in the present embodiment than in the previous embodiment. Furthermore, the parasitic inductance is reduced. This allows a compactor semiconductor device.

Figure 14:
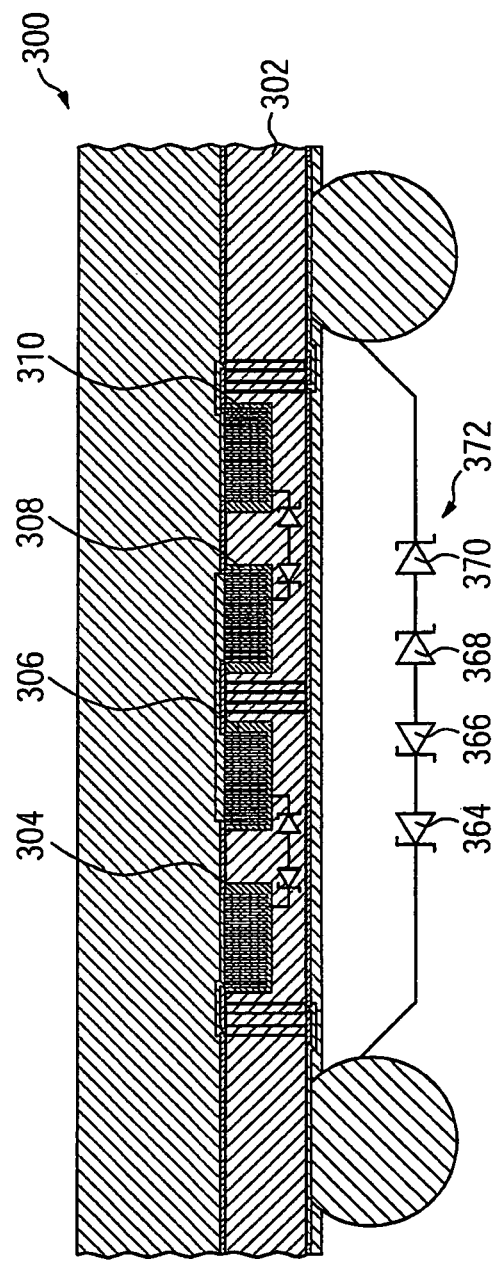
FIG. 14 shows a schematic cross sectional view of a semiconductor device according to a third embodiment.
Figure 15:
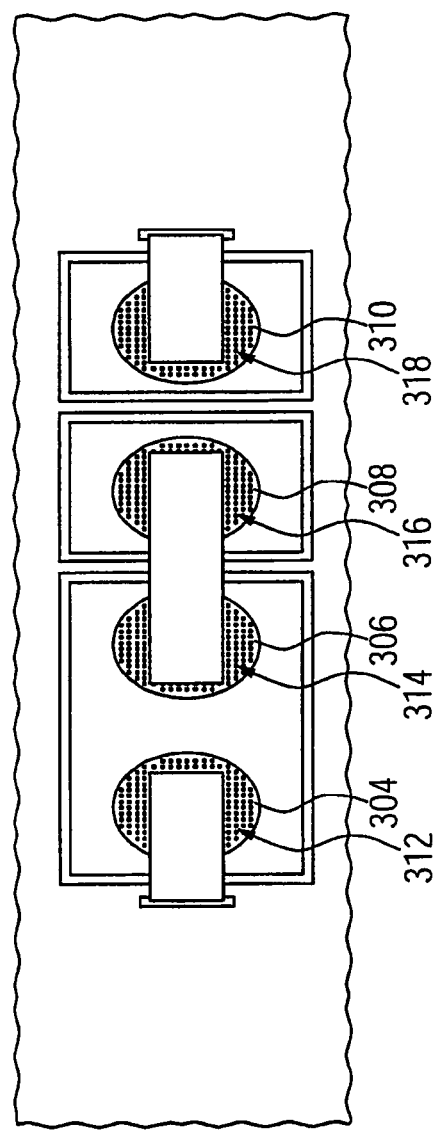
FIG. 15 shows a schematic top view of the semiconductor device of FIG. 14.

Another variation with equivalent functionality is shown in FIGS. 14 and 15. Here, the diodes have n-type conductive regions 304 to 310, which in comparison with the previous embodiments reach deeper into the semiconductor substrate 302. The depth of the n-type regions 304 to 310 is approximately 10 micrometer. Each of the n-type regions contains a respective array 312 to 318 of micro-pores of about 1 Micrometer diameter and filled with a metal such as tungsten W. This structure helps to further reduce the parasitic electrical resistance by reducing the electrical pathway through the semiconductor substrate and increasing the contact area between the respective interconnect and the n-type region. This structure increases also the robustness of the semiconductor device.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. For instance, to reduce a mutual influence of diodes on each other a metallic shield can be provided by connecting the conductive vias to low impedance. This allows a collection of interference.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

The invention claimed is:

1. An semiconductor device, comprising:
   a semiconductor substrate with a thickness of less than about 100 micrometers and with a first substrate side and an opposite second substrate side;
   a plurality of monolithically integrated Zener or avalanche diodes with a reverse breakdown voltage of less than about 20 V, which are defined in the semiconductor substrate and which are connected with each other in a series connection,
   wherein the diodes are defined in a plurality of mutually isolated substrate islands in the semiconductor substrate, at least one diode per substrate island, and
   wherein the substrate islands are laterally surrounded by through-substrate isolations extending from the first to the second substrate side and comprising a filling that electrically isolates a respective substrate island from a respective laterally surrounding area of the semiconductor substrate, wherein a first metallization is provided on the first substrate side, and a second metallization is provided on the second substrate side, and wherein the through-substrate isolations comprise an electrically conductive via, which is electrically isolated from the semiconductor substrate by an insulation layer and which provides an electrical pathway between the first and second substrate sides, wherein the substrate islands have a first conductivity type, and the diodes, to form their respective pn junction, comprise a substrate region of an opposite second conductivity type laterally embedded in the substrate island on one substrate side, and wherein diodes in different substrate islands are connected through the first or second metallization and the via.

2. The semiconductor device of claim 1, wherein the series connection of diodes comprises at least two diodes connected with each other in a back-to-back configuration.

3. The semiconductor device of claim 2, wherein the series connection comprises at least two pairs of serially connected diodes, and wherein the diodes of each pair are connected back-to-front, and wherein the two pairs are connected back-to-back.

4. The semiconductor device of claim 2, wherein two diodes in a respective back-to-back configuration of the series connection of diodes are defined on one respective substrate island.

5. The semiconductor device of claim 1, wherein the substrate has a thickness of less than about 50 micrometer.

6. The semiconductor device of claim 1, wherein the series connection of diodes comprises at least four diodes, the number of diodes being chosen such that a sum of reverse breakdown voltages of the diodes exceeds an application-specific threshold voltage.

7. The semiconductor device of claim 1, wherein neighboring diodes of the series connection have a lateral distance of between about 50 and about 150 μm.

8. The semiconductor device of claim 1, further comprising at least one capacitor or inductor on the semiconductor substrate.

9. A semiconductor assembly comprising a semiconductor device according to claim 1 and a second device.

10. The assembly of claim 8, wherein the second chip comprises an integrated circuit that forms a transceiver according to a Control Access Network standard.

11. A method for fabricating a semiconductor device, comprising
   providing a semiconductor substrate with a first and an opposite second substrate side;
   defining a plurality of diodes in the semiconductor substrate on the first substrate side;
   defining a plurality of substrate islands in the semiconductor substrate laterally surrounded by the trenches, with at least one diode per substrate island;
   fabricating a filling in the trenches that electrically isolates a respective substrate island from a respective laterally surrounding area of the semiconductor substrate;
   thinning the substrate from the second substrate side such that the fillings form through-substrate isolations extending from the first to the second substrate side; and
   providing a first metallization on the first substrate side, and providing a second metallization on the second substrate side,
   wherein fabricating a filling in the trenches comprises depositing an insulation layer in the trenches, followed by fabricating an electrically conductive via in the trenches, which via provides an electrical pathway between the first and second substrate sides, wherein the substrate islands have a first conductivity type, wherein defining the plurality of diodes comprises defining the plurality of diodes that, to form their respective pn junction, comprise a substrate region of an opposite second conductivity type laterally embedded in the substrate island on one substrate side, and wherein the method comprises connecting diodes in different substrate islands through the first or second metallization and the via.

12. The method of claim 11, wherein the step of thinning the substrate comprises:
   mounting a semiconductor wafer comprising the semiconductor substrate as an integral part on a carrier substrate, the first substrate side facing the carrier substrate;
   grinding the semiconductor wafer from the second substrate side.

13. The method of claim 11, comprising, before the thinning, a fabrication of a metallization on the first substrate side.

* * * * *